(12) United States Patent
Gerbi et al.

(10) Patent No.: US 9,399,816 B2
(45) Date of Patent: Jul. 26, 2016

(54) REFURBISHING COPPER AND INDIUM CONTAINING ALLOY SPUTTER TARGETS AND USE OF SUCH TARGETS IN MAKING COPPER AND INDIUM-BASED FILMS

(75) Inventors: Jennifer Gerbi, Midland, MI (US); Robert Nilsson, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 581 days.

(21) Appl. No.: 13/988,621

(22) PCT Filed: Oct. 13, 2011

(86) PCT No.: PCT/US2011/056058
§ 371 (c)(1),
(2), (4) Date: May 21, 2013

(87) PCT Pub. No.: WO2012/074609
PCT Pub. Date: Jun. 7, 2012

(65) Prior Publication Data
US 2013/0248351 A1 Sep. 26, 2013

Related U.S. Application Data

(60) Provisional application No. 61/418,051, filed on Nov. 30, 2010.

(51) Int. Cl.
*B22F 3/04* (2006.01)
*C23C 14/34* (2006.01)
*C23C 14/06* (2006.01)

(52) U.S. Cl.
CPC ......... *C23C 14/3414* (2013.01); *C23C 14/0623* (2013.01); *B22F 2999/00* (2013.01)

(58) Field of Classification Search
CPC ............ C23C 14/3414; C23C 14/0623; B22F 2999/00
See application file for complete search history.

(56) References Cited

U.S. PATENT DOCUMENTS

| 7,504,008 B2 * | 3/2009 | Doan et al. .................. 419/8 |
| 2003/0077199 A1 | 4/2003 | Sandlin et al. |
| 2008/0105542 A1 | 5/2008 | Purdey et al. |
| 2009/0022616 A1 | 1/2009 | Acker et al. |
| 2009/0277777 A1 | 11/2009 | Schultheis et al. |
| 2010/0170786 A1 | 7/2010 | Wang et al. |

FOREIGN PATENT DOCUMENTS

| CN | 1772467 A | 5/2006 |
| EP | 1932939 A1 | 6/2008 |

OTHER PUBLICATIONS

ASM International, Materials Park, Ohio, ASM Handbook vol. 3: Alloy Phase Diagrams: pp. 2•44, Oct. 1990.*
Britting, Stefan et al., "Development of Novel Target Materials for Cu (In, Ga) Se-Based Solar Cells", Plasma Processes and Polymers, 2009, S25-S28, 6, Wiley-VCH Verlag Gmbh &Co. KGaA, Weinheim.

* cited by examiner

Primary Examiner — Jessee Roe

(57) ABSTRACT

This invention relates to a method of refurbishing sputter targets comprising: providing a sputter target comprising a temperature sensitive alloy, having regions depleted of material; providing a powder having a first phase comprising the desired temperature sensitive alloy onto the surface; and pressing the powder onto the surface to form a refurbished target, at temperatures lower than that which would damage the temperature sensitive alloy.

13 Claims, No Drawings

REFURBISHING COPPER AND INDIUM CONTAINING ALLOY SPUTTER TARGETS AND USE OF SUCH TARGETS IN MAKING COPPER AND INDIUM-BASED FILMS

CROSS REFERENCE TO RELATED APPLICATIONS

This application is a 35 USC §371 national phase filing of PCT/US11/56058 filed Oct. 13, 2011, which claims the benefit of U.S. Application No. 61/418,051, filed Nov. 30, 2010.

FIELD OF THE INVENTION

This invention relates to refurbishing of sputter targets and the use of such targets in making chalcogenide based optoelectrically active sputtered thin films.

BACKGROUND OF THE INVENTION

Both n-type chalcogenide materials and/or p-type chalcogenide materials have photovoltaic functionality (also referred to herein photoabsorbing functionality). These materials absorb incident light and generate an electric output when incorporated into a photovoltaic device. Consequently, these chalcogenide-based photoabsorbing materials have been used as the photovoltaic absorber region in functioning photovoltaic devices. Illustrative p-type chalcogenide materials often include sulfides, selenides, and/or tellurides of at least one or more of copper (Cu), indium (In), gallium (Ga), and/or aluminum. Although specific chalcogenide compositions may be referred to by acronyms such as CIS, CISS, CIGS, CIGST, CIGSAT, and/or CIGSS compositions, or the like, the term "CIGS" shall hereinafter refer to all chalcogenide compositions and/or all precursors thereof unless otherwise expressly noted.

It is known that these chalcogenide films can be made by sputtering one or more of the components onto an appropriate substrate potentially followed by chalcogenization. For example, Britting et al, "Development of Novel Target Materials for Cu(In, Ga)Se-Based Solar Cells", *Plasma Process. Polym.* 2009. 6 teaches about the formation of sputter targets having a ternary copper, indium, and gallium phase via casting.

As sputter targets are used, there are areas that are sputtered away more quickly than other areas, resulting in what is commonly known as a "racetrack" groove. Planar geometry targets demonstrate this behavior clearly, with only approximately 20-50% of the material actually removed during sputter deposition from the start to end of life to the target, with the end of life defined as when the deepest part of the racetrack groove penetrates the full target thickness down to the target bonding or backing plate. This percentage is determined by the specific magnetron style and target construction. Rotatable geometry targets demonstrate a "racetrack" consisting of most of the exposed target material, with an additional pronounced racetrack groove near the two ends of the targets, which can also leave a significant amount of alloy behind, although less than the case for the planar targets, with approximately 70-90% of the target material removed during the sputter process.

SUMMARY OF THE INVENTION

Applicants have discovered that when a target comprising copper, indium and preferably also gallium becomes worn it can effectively be refurbished by cold pressing, preferably cold isostatic pressing, a powder comprising a first phase of copper and indium with the worn target to form a refurbished target. The resulting refurbished target can be used to form high quality film as indicated by a low standard deviation of indium to copper ratios in subsequent deposited films. Applicants have further discovered that contrary to the teachings of U.S. Patent Publication 2009/0277777, if the powder contains only elemental copper and elemental indium or alloys of copper and gallium with elemental indium the resulting refurbished target does not produce high quality CIGS precursor material throughout the testing of the target, as described above. Rather applicants have discovered that it is important that the powder includes a phase comprising copper and indium as detected by XRD. In addition, it is important that that the conditions used to refurbish the target do not result in the loss of this copper and indium phase. According to some embodiments, preferably the phase also includes gallium or aluminum. Additional phases or elements may also be included in the powder. Such additional phases may include elemental indium, gallium, copper gallium, binary selenides, sodium compounds, oxygen or sodium contamination, or the like.

Thus, according to a first embodiment this invention is a method comprising:

providing a sputter target comprising copper and indium having a surface with regions depleted of material;

providing a powder having a first phase comprising copper and indium onto the surface; and pressing the powder onto the surface to form a refurbished target without loss of the first phase comprising copper and indium.

DETAILED DESCRIPTION OF THE INVENTION

Providing a Used Target

The initial target may be any target having copper and indium, preferably with copper and indium together in a first phase. The target preferably also includes gallium or aluminum, most preferably gallium. The target may include additional phases that include indium, gallium, copper gallium, metal selenides, metal sulfides, selenium, sulfur, sodium, sodium compounds, oxygen, or the like. Preferably the copper and indium phase or phases is at least 3 weight percent, more preferably at least 5 weight percent, more preferably still at least 10 percent, yet more preferably at least 25 weight percent, even more preferably at least 50 weight percent, and most preferably at least 75 weight percent of the target. Such targets are generally available from GfE Metalle and Materialien GmbH and Heraeus Materials Technology LLC.

The target may be of a standard planar geometry or a rotary geometry target. The target has been used in sputtering and will have had one or more grooves formed in it.

The atomic ratio of (indium plus gallium):copper in the first phase is preferably at least 0.5:1, more preferably at least 1:1, and most preferably at least 1.2:1. The atomic ratio of (indium plus gallium):copper in the first phase is preferably in no more than 4:1, more preferably no more than 2.5:1, more preferably no more than 1.8:1.

The target will have been used in sputtering such that a groove or other defined areas of removed material are formed rendering the surface uneven. (For example, large planar sputter targets are generally rectangular shaped and the removed material is in the shape of a rounded corner rectangular shaped ring; smaller sputter targets may be disc shaped and the removed material is in the shape of an annular type ring.) Preferably, the used target has had at least 10% of the original target material removed.

Providing the Powder

It is necessary for purposes of this invention that the powder used in refurbishment include a first phase comprising both Cu and In. This phase can be detected by X-ray diffraction (XRD) and can be of many different crystal structures, such as cubic, tetragonal, or other. Ga can also be incorporated into this alloy phase, and other alloy or elemental phases comprising In, Cu, and/or Ga may be included. The powder may include additional phases that include indium, gallium, copper gallium, binary selenides, sodium compounds, oxygen, or sodium impurities or the like. Preferably the copper and indium phase or phases is at least is at least 3 weight percent, more preferably at least 5 weight percent, more preferably still at least 10 percent, yet more preferably at least 25 weight percent, even more preferably at least 50 weight percent, and most preferably at least 75 weight percent of total weight of the powder.

The atomic ratio of (indium plus gallium):copper in the first phase is preferably in at least 0.5:1, more preferably at least 1:1, and most preferably at least 1.2:1. The atomic ratio of (indium plus gallium):copper in the first phase is preferably in no more than 4:1, more preferably no more than 2.5:1, more preferably no more than 1.8:1.

The size of powder particles is preferably from about 0.01 microns, more preferably 0.1 microns to about 100 microns, more preferably about 20 microns and most preferably about 10 microns. For, example one sample measured via scanning electron microscopy (SEM) with EDX analysis (energy dispersive x-ray analysis) of the powder used in this example demonstrated a range of sizes from ~0.1 microns to several microns, with multiple compositions detected within single powder grains.

The powder may be made for example by high purity vacuum atomization via vacuum induction melting.

Method of Refurbishment

The powder is filled into the removed portions on the used target (e.g. the racetrack area), with extra powder to allow for density increases as a result of pressing. The target preferably is first uniaxially pressed in order to solidify the piece for handling in the isostatic press. This pressure can be of a wide range; preferably 500 pounds per square inch (psi) (3 megapascals, MPa) to the maximum obtainable by the uniaxial press; preferably 1000 lbs to 5000 lbs (7-30 MPa), more preferably 2000 lbs to 4000 lbs (10-30 MPa). The piece is then removed and loaded into a cold isostatic press. Special optimized tooling may be used with the piece in order to reduce waste of the final machining step, such that the surface of the target closely matches what was originally provided. This pressing step uses a pressure of between 30,000 psi (200 MPa) to the maximum available that the press can achieve; more preferably, 34,000 to 36,000 psi (230-250 MPa). Preferably, the upper temperature range of pressing during refurbishment should be below 500° C., more preferably below 300° C.; yet more preferably, below 250° C.; more preferably still, below 150° C., and most preferably no higher than 130° C. The temperature should be low enough that the original bonding of the target to the backing plate is not damaged, and that the first phase comprising copper and indium in the powder is not eliminated.

After the used sputter target is refurbished, the surface may be planarized if needed by standard sputter target fabrication techniques such as finishing in a lathe and/or grinding, taking care to limit the additional introduction of contaminants onto the target.

According to some embodiments it may be helpful to use an additional layer or treatment before applying the powder to the removed portions of the used target.

Additional layers could include one or more of a bond promoter or an indicator material. Additional treatment could include surface roughening. For example, to apply a bond promoter or indicator material, a thin layer could be applied by sputtering such a layer (such as pure In) onto the target surface; by applying of a liquid (such as a low melting point Ga—In alloy); or by applying a small amount some powder of a different composition than the powder used for the target bulk. The additional layer could serve both as a bond promoter and indicator material, such as a thin layer of indium or an indium gallium alloy. Thickness of the additional layer is preferably less than 10% of the final target thickness.

The indicator layer is intended to provide detection of the sputtering through the initial interface where the target was refurbished, in order to provide for higher quality re-refurbishment onto a "fresh" surface of the original target. Preferably, the indicator is selected such that although detectable it would not significantly negatively impact the resulting film and causes no device contamination in the sputter chamber. The method of this invention may comprise using analytical methods such as plasma detection methods such as optical emission (OES) or absorption spectroscopy; gas detection methods such as residual gas analysis, or film detection methods such as in-line optical cameras, X-ray fluorescence (XRF), Raman scattering, or the like to detect the indicator layer. Particularly useful materials as indicators may be a layer of powder or even sputtered CIG that is more In-rich than the bulk of the target, which would be observable by OES or XRF, but still produces high efficiency solar cells.

After pressing there may be a final optional step of mechanical surface planarization if necessary.

According to some embodiments, this invention may further comprise the subsequent re-refurbishment of a previously refurbished sputter target. As a refurbished target is used, after the refurbished material has been sputtered, the target can again be refurbished. As discussed above, a "fresh" racetrack surface may be beneficial for the bonding of the additional powder to the target; thus, the optional indicator discussed above may be used to indicate when the original racetrack surface has been sputtered into and past, such that the target is ready for re-refurbishment. Re-refurbishment may be performed repeatedly. However, if the racetrack depth must be lower for each subsequent re-refurbishment, the refurbishment will be limited by the need to maintain the original target bonding to its backing and ensuring the backing plate is not damaged.

Method of Use of Refurbished Target

As noted above the targets refurbished according to this method have the desirable behavior in that the composition of films sputtered from the target is sufficiently stable as to meet desired specification for an industrially feasible deposition process throughout the usable lifetime of the target. This stability is shown by examining the standard deviation in (indium plus gallium):copper ratios in films deposited from the targets. Applicants have discovered that having a first phase having both copper and indium is important to this stability.

More specifically stability can be examined by using a target after refurbishment and an initial conditioning. As one specific example, for a 5 cm diameter circular target, the initial conditioning consists of lighting a plasma at 50 W, ramping up the sputter power 25 W per 2 hours over a period of four hours to 100 W. The targets can then be sputtered at 100 W for eight hours to remove any surface tooling residue, marks, and contamination, as is usually done for such targets when used for thin film deposition processes. Targets can be sputtered in Ar, at a suitable pressure. Applicants used a pressure of 4.5 mTorr; however, a wide range of pressures can be used as long as magnetron sputtering is maintained, and the testing should use identical conditions for sputtering all samples. This conditioning recipe can be scaled up for larger planar or rotatable targets by calculating the effective power density of the racetrack of the larger vs. 5 cm diameter targets using commonly known calculations in the sputter deposition field. As another example, on larger, rectangular planar targets of 75 cm×15 cm dimensions, sputtered at a power of 500 W to 1 kW or more, pressures between 3 mTorr to 10 mTorr have been used by applicants. After conditioning, at least eight films are deposited and measured that encompass 1.8 KW-hours of target usage per every 19.6 $cm^2$ of target surface, under identical deposition conditions. For the 5 cm diameter targets, this would be 1.8 KW-hours of growth; for the 75 cm×15 cm targets, this would be 103 KW-hours of growth.

The deposition composition stability is examined by analyzing the atomic ratio of [In+Ga]/[Cu] (regardless of other elements deposited along with these) in the deposited film. The targets refurbished according this method preferably exhibit a standard deviation on that ratio of less than 0.5; more preferably, less than 0.2; more preferably, equal to or less than 0.1. As noted above, this deposition composition stability occurs only when the existence of at least one phase that comprises Cu and In within the same phase, as detected by X-ray diffraction (XRD). This stability is in clear contrast to the use of compound or multiple In+CuGa targets that do not contain a phase of Cu and In. In that latter case there is a significant change in the composition of films sputtered from the targets, where much more In is sputtered in the early stages of target age, and the In deposition rate degrades rapidly, resulting in very Cu-rich sputtered films.

According to some embodiments, this invention may further comprise sputtering from the refurbished target to form a copper indium based film which may be a chalcogenide absorber layer or a precursor to a chalcogenide absorber layer. This step may occur according to known methods. The precursor and/or absorber layer is preferably formed on a conductive substrate and additional layers are formed over the absorber layer including one or more of a buffer layer, a window layer including a transparent conductive layer, and electrical collecting system.

EXAMPLES

In the following examples these materials and processes were used:
Sputter targets: (See Table 1)

2" diameter, ¼" thick sputter targets were sourced commercially, as well as were fabricated in-house from pre-alloyed powder, as described below in the "powder" description. The commercially available targets were requested to have the following atomic compositions: [In+Ga]/Cu=1.2; [Ga]/[In]=0.25, 4 nines purity. The in-house targets are pressed using pre-alloyed powder of the atomic composition [In+Ga]/Cu=1.2; [Ga]/[In]=0.25, 4 nines purity. The in-house targets are fabricated by first uniaxial pressing a 3" square piece at a pressure of 3,000 psi (20 MPa), with a resultant density of approximately 73%. This is followed by an isostatic cold pressing treatment of the piece at 36,000 psi (250 MPa) with a resultant density near 100%. A 2" target round is machined from this piece, bonded to a Cu backing plate by a commercial target bonder, and the surface is machined smooth using methods normally used for target fabrication. All targets used the same type of Cu backing plate and bonding.

Powder

The pre-alloyed powder is of the atomic composition [In+Ga]/Cu=1.2; [Ga]/[In]=0.25, 4 nines purity. The powder has a significant particle size distribution of between 0.01 microns to about 10 microns, with some particles including multiple phases, as observed by SEM EDS measurements.

Sputtering and Testing Procedure

2" diameter, ¼" thick sputter targets as described above are sputtered in a sputter system using substantially the following conditions: 100 W, pulsed-DC enabled sputtering, Ar gas at a pressure of 4.5 mTorr, room temperature substrate. The substrates are 2" square pieces of soda lime glass coated with a 800 nm thick layer of Molybdenum, and the target to substrate distance was 10 cm. The targets are all initially conditioned by slowly ramping up the sputter power, starting at 50 W, over a period of four hours. The targets are then sputtered at 100 W for eight hours to remove any surface tooling residue or marks. The targets are subsequently sputtered in intervals, after each which the substrate is removed, a new piece is installed, and the used piece is tested for film composition and deposition rate by ICP-OES (inductively coupled plasma optimal emission spectroscopy). Compositional stability is calculated by using the standard deviation of the ([In]+[Ga])/[Cu] ratio as measured by ICP-OES, an is presented in Table 1 for all targets tested. The targets are tested for a minimum of 1.8 KW-hours of use with at least eight films deposited during that time frame.

TABLE 1

| Target # | Fabrication | XRD: Detected Phases | StDev of ([In] + [Ga])/[Cu] |
|---|---|---|---|
| CIG 1 | In House | Cu9Ga4<br>Cubic CIG<br>In<br>Tetragonal CIG | 0.09 |
| CIG 2 | Commercial | In<br>Cu9Ga4<br>Cubic CIG | 0.09 |
| CIG 3 | CIG2 refurbished with CIG alloy powder | Cu9Ga4<br>Cubic CIG<br>In<br>Tetragonal CIG | 0.04 |
| CIG 4 | CIG 1 refurbished with CuGa + In Elemental Powders Mixed | In<br>Cu<br>Cu9Ga4 | 0.77 |

Example 1

A fully used sputter target, CIG2 described in Table 1, is refurbished with the commercially sourced CIG powder as described above. The powder is added by placing the used target in a rubber mold, pouring the powder onto it, and sealing the mold. This assembly is then cold isostatically pressed at 36,000 psi (250 MPa) causing the powder to densify and bond to the target. XRD is performed of the refurbished target before use, and the results are included in Table 1 as CIG3. The refurbished target demonstrated both cubic and tetragonal CIG XRD peaks.

The refurbished target ("CIG 3") was installed into a sputter system, and sputtered at identical conditions to that originally used to age the target: 100 W, 4.5 mTorr Ar, room temperature substrate of a Mo layer on soda lime glass. Several films were deposited to test the stability of the film composition with target age. Stability of the film composition, as measured by the standard deviation of the III/IV ratio ([In+Ga]/[Cu]) is shown in Table 1, as are the other nonrefurbished targets tested. The refurbished target films demonstrate the same standard deviation of composition variation as the new targets that comprise at least one phase of both Cu and In. The refurbished target demonstrates similar sputter quality as the original target in that no major arcing or other types of damage are observed.

Comparative Example 2

A fully used sputter target, CIG1 described in Table 1, is refurbished with commercially sourced elemental In+CuGa powder as described below. After refurbishment, this target is called CIG4. Commercially available powder was obtained of In (four nines pure) and CuGa (four nines pure, Ga/Cu=25 atomic %). The powders were mixed in a ratio such that the final, mixed powder had an atomic composition of [In+Ga]/Cu=1.2; [Ga]/[In]=0.25. This powder was filled into a used CIG1 target and pressed using identical conditions as Example 1. XRD was performed of the refurbished target material, and the results are included in Table 1. The refurbished target did not show any XRD peaks that showed a clear phase comprising Cu and In.

The target was installed into the same sputter system, conditioned, and tested identically to Example 1. The film composition stability was much degraded as compared to the alloy powder refurbished target, sputtering extremely In-rich at the beginning of life, and sputtering very Cu-rich films by the end of testing.

Example 3

A sample of the refurbished target material (originally made by cold pressing at 36,000 psi (250 MPa), using CIG alloy powder comprising at least one phase having both Cu and In as shown by XRD analysis) was annealed at a temperature of 650° C. in a vacuum oven, in order to replicate the low end of the temperature used in a hot isostatic pressing (HIP) apparatus. XRD was performed of this sample. Before heating, it clearly demonstrates the existence of a phase comprising Cu and In by XRD analysis, along with In and $Cu_9Ga_4$ phases. After heating, the sample showed only In, $Cu_9Ga_4$, and $CuGa_2$ phases, with no phases comprising In and Cu.

Example 4

Test pucks of the CIG alloy powder that demonstrate a phase comprising Cu and In by XRD analysis were pressed using a range of different pressures, and the resultant density measured as a percentage of the expected elemental density. Results are shown in Table 2. It is clear from these results that the pressing pressure is preferably over 30,000 psi (200 MPa), and more preferably 35,000 psi (240 MPa) or over. We note that the theoretical density of the powders are established by dry and wet weighing of the powder and applying Archimedes' principle. This method confirmed our theoretical density estimated by linear combination of the individual elements.

TABLE 2

| Pressure (PSI) | Percent of Theoretical Maximum Density |
| --- | --- |
| 0 | 30 |
| 3816 | 69 |
| 4000 | 73 |
| 5093 | 74 |
| 6366 | 76 |
| 6366 | 76 |
| 6366 | 76 |
| 6366 | 74 |
| 8913 | 82 |
| 12732 | 86 |
| 30000 | 99 |
| 30000 | 96 |
| 35000 | 94 |
| 35000 | 99 |
| 35000 | 100 |
| 35000 | 100 |
| 35000 | 99 |
| 35000 | 100 |
| 35000 | 99 |
| 35000 | 100 |

What is claimed is:

1. A method comprising:
providing a sputter target comprising copper and indium having a surface with at least one region depleted of material;
providing a powder having a first phase comprising copper and indium onto the surface on at least the at least one region depleted of material; and cold isostatic pressing the powder onto the surface to form a refurbished target.

2. The method of claim 1 where in the sputter target comprises at least one phase having both copper and indium in the phase.

3. The method of claim 1 wherein the sputter target further comprises one or more of gallium, aluminum, sodium, selenium, sulfur and oxygen.

4. The method of claim 1 wherein the first phase in the powder comprises at least copper, indium and gallium and the atomic ratio of gallium plus indium to copper is from 0.5:1 to 2:1.

5. The method of claim 1 wherein the first phase comprises at least 3% by weight of the powder.

6. The method of claim 5 wherein the first phase comprises at least 10% by weight of the powder.

7. The method of claim 1 wherein the temperature during pressing is less than 500° C.

8. The method of claim 7 wherein the temperature is less than 150° C.

9. The method of claim 1 further comprising at least one of providing a surface treatment to the depleted regions prior to applying the powder, or applying a material that will form a bond or indicator layer prior to applying the powder.

10. The method of claim 1 further comprising sputtering from the refurbished target to form a film.

11. The method of claim 10 wherein the standard deviation of the atomic ratio of indium to copper in the deposited film from a sample of at least eight films that encompass the first 1.8 KW-hours of target usage per ever 19.6 $cm^2$ of target surface is less than 0.2.

12. The method of claim 10 wherein the target comprises an indicator layer applied during refurbishment and the method comprises detecting when the target has worn through the indicator layer.

13. The method of claim 12 comprising repeating the step of providing the powder on the surface of target after the indicator layer is detected and cold isotactic pressing to refurbish again.

* * * * *